(12) United States Patent
Kuramitsu

(10) Patent No.: US 11,503,714 B2
(45) Date of Patent: Nov. 15, 2022

(54) THIN FILM BOARD, CIRCUIT ELEMENT, MANUFACTURING METHOD OF CIRCUIT ELEMENT, AND ELECTRIC SIGNAL TRANSMISSION METHOD

(71) Applicant: ANRITSU CORPORATION, Kanagawa (JP)

(72) Inventor: Kota Kuramitsu, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/314,414

(22) Filed: May 7, 2021

(65) Prior Publication Data
US 2021/0368624 A1 Nov. 25, 2021

(30) Foreign Application Priority Data
May 25, 2020 (JP) .............................. JP2020-090920

(51) Int. Cl.
*H05K 1/18* (2006.01)
*H05K 3/40* (2006.01)
*H05K 1/11* (2006.01)

(52) U.S. Cl.
CPC .............. *H05K 1/181* (2013.01); *H05K 1/115* (2013.01); *H05K 3/4076* (2013.01)

(58) Field of Classification Search
CPC .................................................... H05K 1/181
USPC ........................................................ 174/260
See application file for complete search history.

(56) References Cited

U.S. PATENT DOCUMENTS

| 5,496,971 A * | 3/1996 | Moriizumi ............ H01L 23/5386 174/262 |
| 5,608,192 A * | 3/1997 | Moriizumi ............ H01L 23/5384 174/255 |
| 10,779,407 B1 * | 9/2020 | Chen ........................ H05K 1/114 |

(Continued)

FOREIGN PATENT DOCUMENTS

| JP | 2000-031317 A | 1/2000 |
| JP | 2010-068405 A | 3/2010 |

OTHER PUBLICATIONS

ATP Applied Thin-Film Products, "Standard Dimensions and Tolerances Illustration", http://www.thinfilm.com/docs/atp_dim_and_tol.pdf, searched Mar. 10, 2020.

(Continued)

*Primary Examiner* — Stanley Tso
(74) *Attorney, Agent, or Firm* — Pearne & Gordon LLP

(57) ABSTRACT

A thin film board according to the present invention has a structure in which a land, which is a connection portion with a transmission line of a printed circuit board, is used as a back wiring and extends from the end to the inside of the thin film board, and the back wiring and the front wiring are connected by a through hole. In the structure of this thin film board, the land does not become a stub and does not affect the high frequency characteristics of the circuit element. That is, there is no trade-off between the connectivity between the printed circuit board and the thin film board and the high frequency characteristics of the circuit element. Therefore, the thin film board and the circuit element in which the thin film board is mounted on the printed circuit board can support high frequency electric signals up to 60 GHz.

7 Claims, 4 Drawing Sheets

(56) References Cited

U.S. PATENT DOCUMENTS

2013/0202340 A1* 8/2013 Zhang .................. H01H 13/705
                                                              400/490
2022/0141954 A1* 5/2022 Schumann ........... H05K 3/4038
                                                              174/253

OTHER PUBLICATIONS

XMicrowave Modular by Design, "X-MWprobe", https://www.xmicrowave.com/wp-content/uploads/X-MWprobe_V1_web.pdf, searched Mar. 10, 2020.

* cited by examiner

THIN FILM BOARD, CIRCUIT ELEMENT, MANUFACTURING METHOD OF CIRCUIT ELEMENT, AND ELECTRIC SIGNAL TRANSMISSION METHOD

TECHNICAL FIELD

The present disclosure relates to a thin film board mounted on a printed circuit board, a circuit element in which a thin film board is mounted on a printed circuit board, a manufacturing method of a circuit element, and an electric signal transmission method by the circuit element.

BACKGROUND ART

In the related art, when a thin film board is mounted on a printed circuit board, a HalfVia structure has been used for connecting transmission lines (see, for example, Non-Patent Documents 1 and 2). FIGS. 1 and 2 are diagrams for explaining the HalfVia structure. FIG. 1 is a perspective view of the circuit element 300, and FIG. 2 is a cross-sectional view of the circuit element 300 cut along a YZ plane. A printed circuit board 20 has a transmission line 25, a back metal 27 for grounding, a top metal 22, and a through hole 21 that electrically connects the back metal 27 and the top metal 22. The thin film board 10 has a front wiring 15, a back metal 18, a bottom surface (land) 14 connected to the transmission line 25 of the printed circuit board 20, and an electrode (HalfVia) 13 that electrically connects the front wiring 15 and the land 14. A structure in which the electrode 13 is constructed on the side surface of the thin film board 10, and the land 14 and the front wiring 15 are connected is called a "Halfvia structure".

RELATED ART DOCUMENT

Non-Patent Document

[Non-Patent Document 1] "Standard Dimensions and Tolerances Illustration", http://www.thinfilm.com/docs/atp_dim_and_tol.pdf, searched Mar. 10, 2020

[Non-Patent Document 2] "X-MWprobe", https://www.x-microwave.com/wp-content/uploads/X-MWprobe_V1_web.pdf, searched Mar. 10, 2020

DISCLOSURE OF THE INVENTION

Problem that the Invention is to Solve

In the case of the HalfVia structure, in order to secure the conduction between the land 14 and the transmission line 25 of the printed circuit board 20 by the soldering and the conductive adhesive, the adhesive area between the land 14 and the transmission line 25 of the printed circuit board 20 is required to have a certain value or more, and the land 14 is required to have a certain size. For example, the size of the land 14 is required to have an area of about 300 μm×300 μm. On the other hand, the land 14 becomes a stub and creates a parasitic capacitance between the land 14 and the back metal 27. FIG. 3 is a diagram illustrating this state in an electric circuit. When a high frequency (for example, 10 GHz or more) electric signal is propagated in such a circuit (when an electric signal flows from the transmission line 25 in the direction of the front wiring (or vice versa)), the high frequency characteristics deteriorate due to the parasitic capacitance generated in the land 14.

As described above, the circuit element having the HalfVia structure has a trade-off relationship between the connectivity between the printed circuit board and the thin film board and the high frequency characteristics of the circuit element. Considering this trade-off relationship, the electric signal that can be transmitted by the HalfVia structure is limited to about 30 GHz. That is, the circuit element having the HalfVia structure has a problem that it is difficult to support a high frequency signal of 30 GHz or more.

Therefore, in order to solve the above problems, an object of the present invention is to provide a thin film board, a circuit element, a method for manufacturing a circuit element, and an electric signal transmission method having a structure capable of supporting a high frequency signal of 30 GHz or more.

Means for Solving the Problem

In order to achieve the above object, a thin film board according to the present invention is connected to the transmission line of the printed circuit board by the back wiring disposed on the back surface, and further, the back wiring and the front wiring are connected by a through hole.

Specifically, a thin film board according to the present invention includes a first through hole that electrically connects a front surface and a back surface of the thin film board; a back wiring that conducts with the first through hole, and is disposed on the back surface of the thin film board so as to extend from the first through hole to an end of the thin film board; and a front wiring that is electrically connected to the first through hole, and is disposed on the front surface of the thin film board, in a direction which is different from an extension direction of the back wiring from the first through hole.

A circuit element according to the present invention is a circuit element including a printed circuit board with a transmission line formed on a front surface thereof and a thin film board, in which the thin film board is mounted on the printed circuit board such that the back wiring in an end portion of the thin film board comes into contact with a one end surface of the transmission line.

At this time, it is preferable that the thin film board and the printed circuit board are fixed with an adhesive or solder, as in the circuit element according to the present invention.

A manufacturing method of a circuit element according to the present invention includes forming a first through hole that electrically connects a front surface and a back surface of the thin film board at a position separated from an end of the thin film board by a predetermined distance; forming a front wiring on the front surface of the thin film board so as to be electrically connected to the first through hole; forming a back wiring that is electrically connected to the first through hole and extends to the end of the thin film board, on the back surface of the thin film board; and mounting the thin film board on the printed circuit board such that the back wiring in an end portion of the thin film board comes into contact with a one end surface of a transmission line formed on a front surface of the printed circuit board.

An electric signal transmission method according to the present invention includes causing an electric signal propagating through a front wiring disposed on the front surface of the thin film board to be electrically connected to the back surface of the thin film board via a first through hole formed in the thin film board, propagate to an end of the thin film board by the back wiring disposed on the back surface of the thin film board, and input to a one end surface of the transmission line formed on the front surface of the printed circuit board which is in contact with the back wiring at the end portion of the thin film board.

The present thin film board has a structure in which a land, which is a connection portion with a transmission line of a printed circuit board, is used as a back wiring and extends from the end to the inside of the thin film board, and the back wiring and the front wiring are connected by a through hole. In the structure of this thin film board, the land does not become a stub and does not affect the high frequency characteristics of the circuit element. That is, there is no trade-off between the connectivity between the printed circuit board and the thin film board and the high frequency characteristics of the circuit element. Therefore, the thin film board and the circuit element in which the thin film board is mounted on the printed circuit board can support high frequency electric signals up to 60 GHz.

Therefore, the present invention can provide a thin film board, a circuit element, a method for manufacturing a circuit element, and an electric signal transmission method having a structure capable of supporting a high frequency signal of 30 GHz or more.

The above inventions can be combined as much as possible.

Advantage of the Invention

The present invention can provide a thin film board, a circuit element, a method for manufacturing a circuit element, and an electric signal transmission method having a structure capable of supporting a high frequency signal of 30 GHz or more.

BEST MODE FOR CARRYING OUT THE INVENTION

Figure 1:
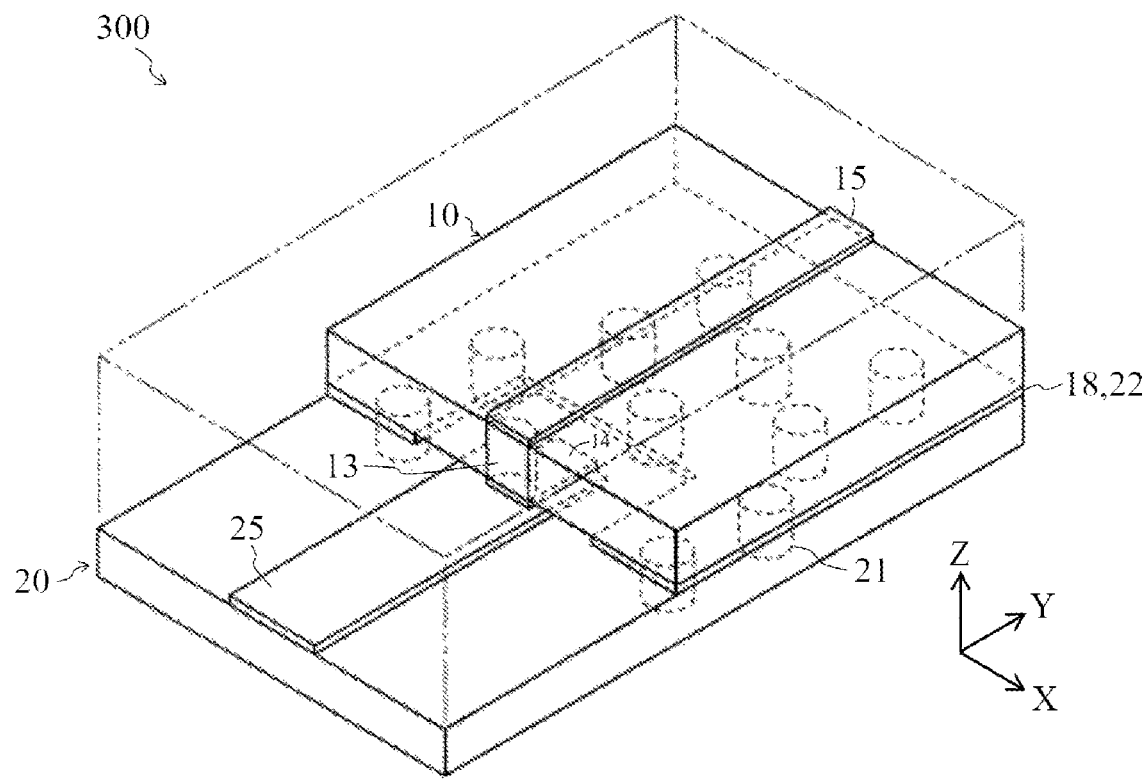
FIG. 1 is a diagram illustrating a HalfVia structure.

An embodiment of the present invention will be described with reference to the accompanying drawings. The embodiment described below is an example of the present invention, and the present invention is not limited to the following embodiment. In the present specification and the drawings, the components having the same reference numerals shall indicate the same components. Further, in the present specification, a description will be made with the positive side in the Z direction as the top and the negative side in the Z direction as the bottom.

Figure 4:
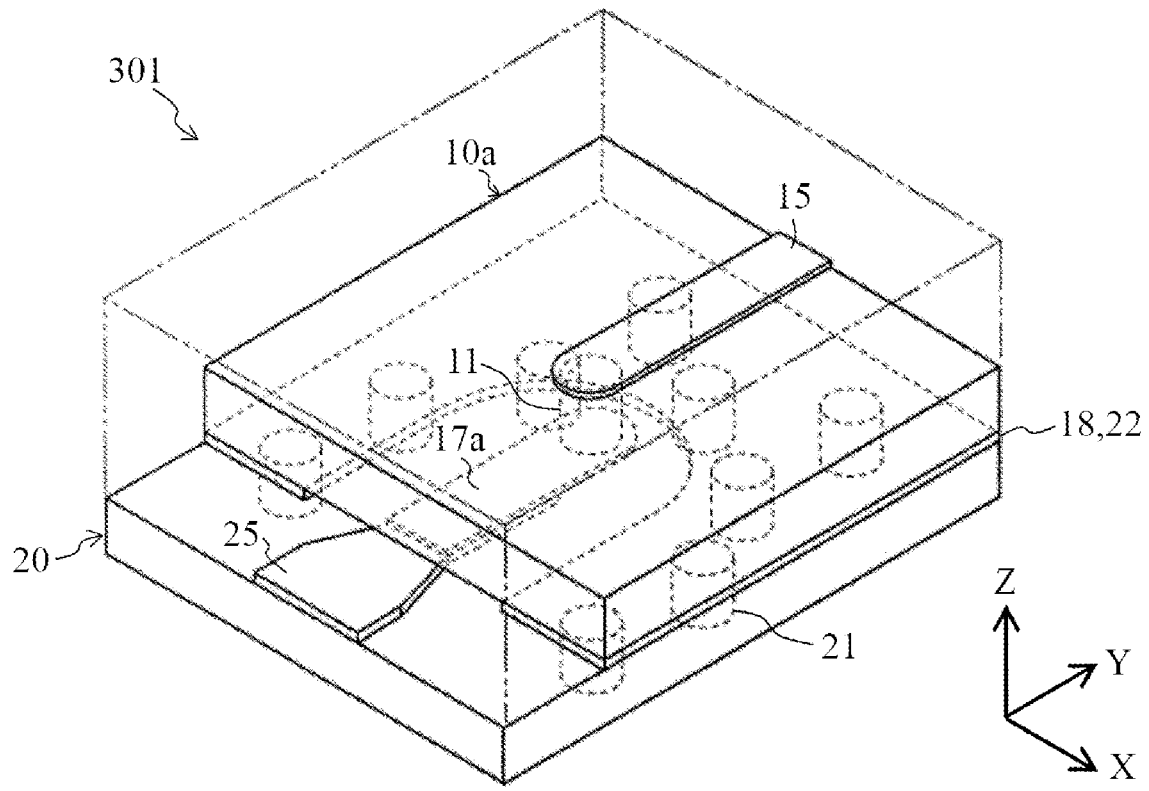
FIG. 4 is a diagram illustrating a thin film board and a circuit element according to the present invention.
Figure 5:
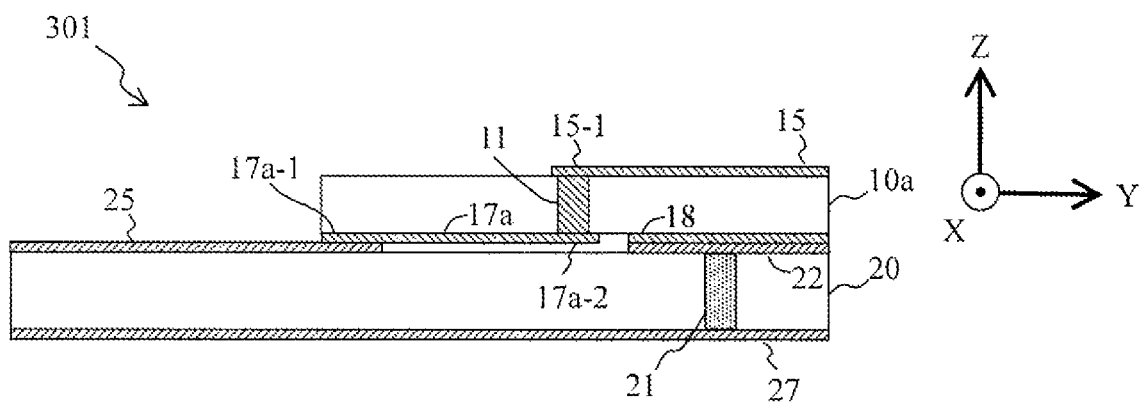
FIG. 5 is a diagram illustrating the thin film board and the circuit element according to the present invention.

FIGS. 4 and 5 are diagrams for explaining a circuit element 301 of the present embodiment. FIG. 4 is a perspective view of the circuit element 301, and FIG. 5 is a cross-sectional view of the circuit element 301 cut along the YZ plane. The circuit element 301 includes a printed circuit board 20 having a transmission line 25 formed on its front surface, and a thin film board 10a, and the thin film board 10a is mounted on the printed circuit board 20 such that the back wiring 17a at the end portion of the thin film board 10a is in contact with the one end surface of the transmission line 25. For example, the thickness of the thin film board 10a in the Z direction is 250 μm.

The thin film board 10a includes a through hole 11 (first through hole) that electrically connects a front surface and a back surface, a back wiring 17a that is electrically connected to the through hole 11, and is disposed on the back surface of the thin film board 10a so as to extend from the through hole 11 to the end of the thin film board 10a, and a front wiring 15 that is electrically connected to the through hole 11, and is disposed on the front surface of the thin film board 10a, in a direction which is different from a direction from the through hole 11 to the end of the thin film board 10a. Further, the thin film board 10a has a back metal 18 (first back metal). On the other hand, the printed circuit board 20 has a transmission line 25, a back metal for grounding, a top metal 22, and a through hole 21 (second through hole) that electrically connects the back metal 27 (second back metal) and the top metal 22.

Figure 6:
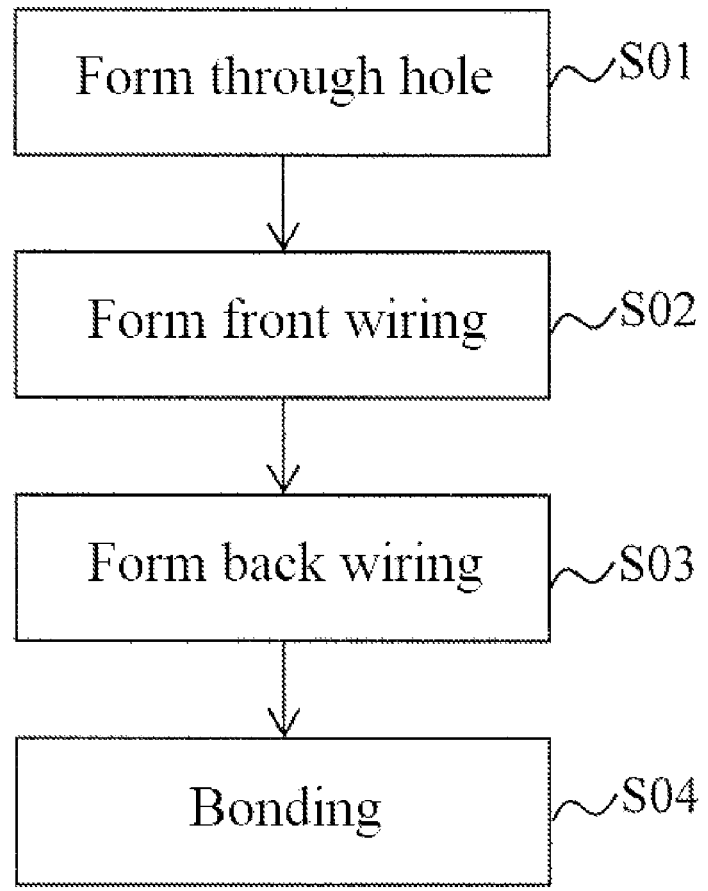
FIG. 6 is a diagram illustrating a method for manufacturing a circuit element according to the present invention.

The circuit element 301 is manufactured as shown in FIG. 6. First, in the through hole forming step S01, a through hole 11 that electrically connects the front surface and the back surface of the thin film board 10a is formed at a position separated from the end of the thin film board 10a by a predetermined distance. The diameter of the through hole 11 is, for example, 200 μm. The predetermined distance is, for example, 500 μm, and may be 500 μm or more depending on the type of circuit element.

Next, in the front wiring forming step S02, the front wiring 15 is formed on the front surface of the thin film board 10a so as to be electrically connected to the through hole 11. However, unlike the thin film element 10 of FIGS. 1 and 2, the front wiring 15 of the thin film board 10a is not formed up to the end of the thin film board 10a. In the present specification, the end portion of the front wiring 15 near the end of the thin film board 10a will be described as one end 15-1. The line width of the front wiring 15 is, for example, 240 μm.

Further, in the back wiring forming step S03, on the back surface of the thin film board 10a, the back wiring 17a that is electrically connected to the through hole 11 and extends to the end of the thin film board 10a is formed. On the back surface of the thin film board 10a, a back wiring 17a is formed as a substitute for the land 14 on the back surface of the thin film element 10 of FIGS. 1 and 2. The land 14 of the thin film element 10 is formed at the end of the thin film element 10, but the back wiring 17a is a wiring extending from the end of the thin film board 10a to the through hole 11. In the present specification, a description will be made with the end side of the thin film board 10a of the back wiring 17a as a first end 17a-1, and the tip connected to the through hole 11 as a second end 17a-2. The line width of the back wiring 17a is, for example, 300 μm.

In addition, a back metal 18 is formed on the back surface of the thin film board 10a so as not to come into contact with the back wiring 17a and the through hole 11. Either the front wiring forming step S02 or the back wiring forming step S03 may be performed first.

Further, in the bonding step S04, the thin film board 10a is mounted on the printed circuit board 20 such that the back wiring 17a at the end portion of the thin film board 10a comes into contact with the one end surface of the transmission line 25 formed on the front surface of the printed circuit board 20. Specifically, the thin film board 10a is mounted on the printed circuit board 20 such that the first end 17a-1 of the back wiring 17a comes into contact with one end of the transmission line 25, and is fixed with an adhesive or the like. Further, at this time, since the back metal 18 of the thin film board 10a and the top metal 22 of the printed circuit board 20 also come into contact with each other, the potential of the back metal 18 becomes equal to the potential (ground potential) of the back metal 27 through the through hole 21 of the printed circuit board 20. The thin film board 10a and the printed circuit board 20 may be fixed with an adhesive or solder.

Here, as shown in FIG. 4, in a case where the line width of the transmission line 25 of the printed circuit board 20 is thicker than the line width of the back wiring 17a (for example, 430 μm), the line width of the transmission line 25 may be narrowed toward one end so as to match the line width (for example, 300 μm) of the back wiring 17a under the thin film board 10a.

In the circuit element 301 manufactured in this way, the electric signal is transmitted as follows. An electric signal propagating through the front wiring 15 disposed on the front surface of the thin film board 10a is electrically connected to the back surface of the thin film board 10a via the through hole 11 formed on the thin film board 10a, propagates up to the end (first end 17a-1) of the thin film board 10a by the back wiring 17a disposed on the back surface of the thin film board 10a, and input to a one end surface of the transmission line 25 formed on the front surface of the printed circuit board 20 which is in contact with the back wiring (first end 17a-1) at the end portion of the thin film board 10a. The electric signal propagating through the transmission line 25 of the printed circuit board 20 is transmitted in the reverse of the above.

Figure 2:
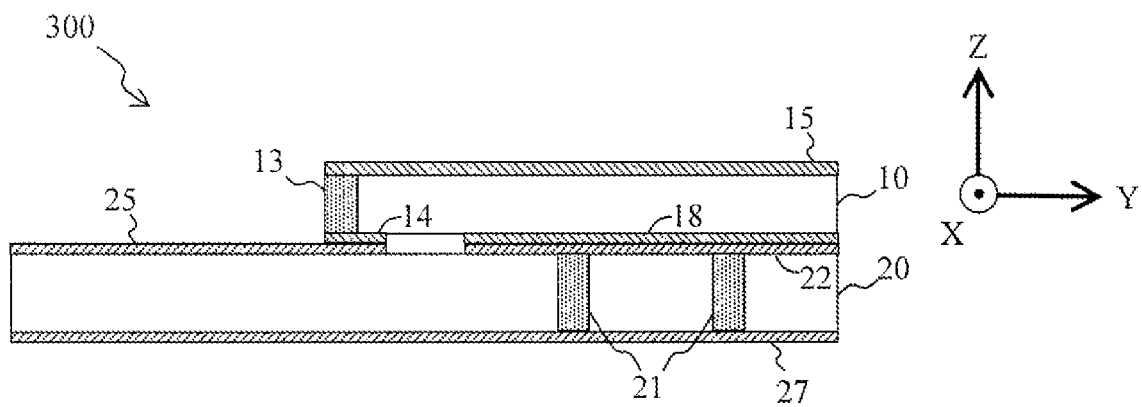
FIG. 2 is a diagram illustrating a HalfVia structure.
Figure 3:
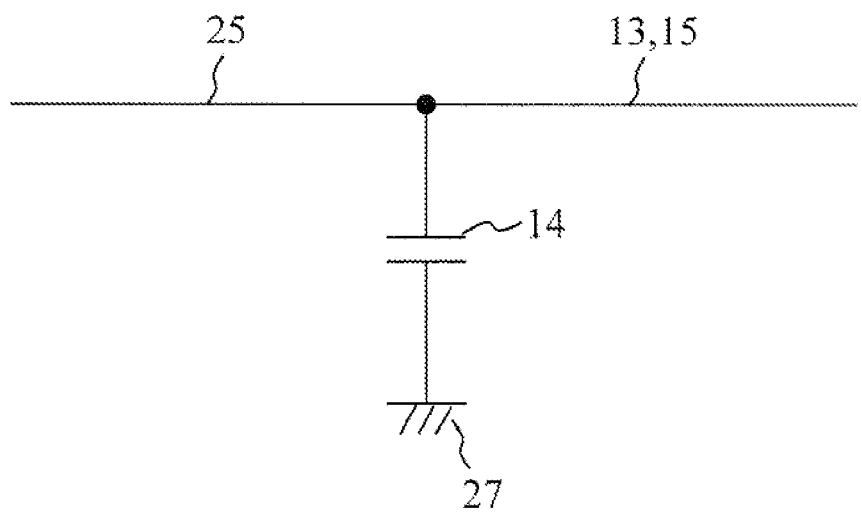
FIG. 3 is a diagram illustrating a subject of the present invention.
Figure 7A:
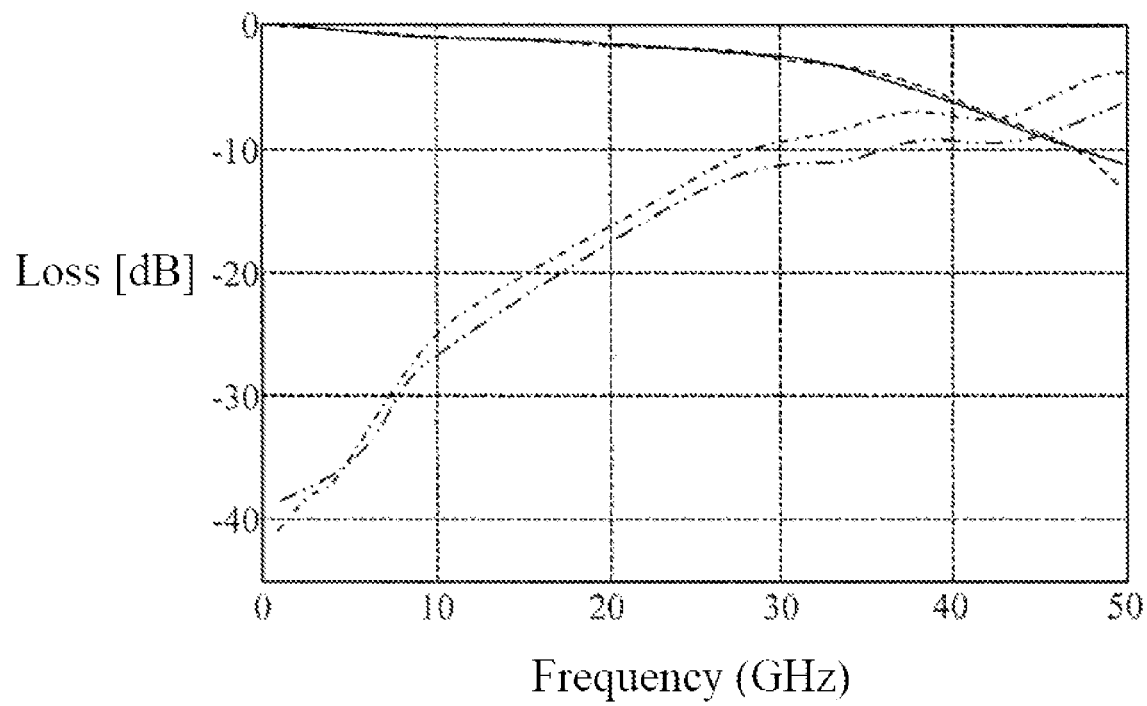
FIGS. 7A and 7B are diagrams illustrating the effect of the circuit element according to the present invention.
Figure 7B:
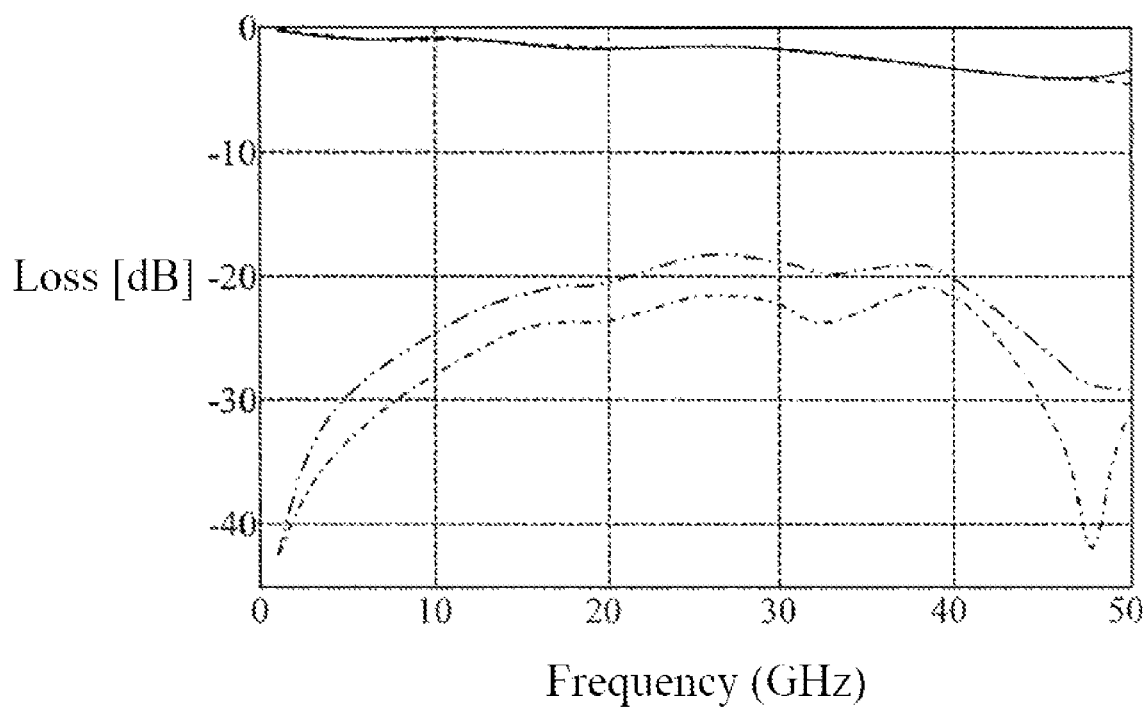

FIG. 7A is a diagram illustrating the bonding characteristics between the printed circuit board and the thin film board of the circuit element 300 of FIGS. 1 and 2, and FIG. 7B is a diagram illustrating the bonding characteristics between the printed circuit board and the thin film board of the circuit element 301 of the present embodiment. The horizontal axis is frequency (GHz) and the vertical axis is loss (dB). The solid line is the insertion loss of the electric signal flowing from the printed circuit board to the thin film board, the broken line is the insertion loss of the electric signal flowing in the opposite direction, the dash line is the return loss of the electric signal flowing from the printed circuit board to the thin film board, and the two-dot chain line is the return loss of the electric signal flowing in the opposite direction.

Comparing FIG. 7A and FIG. 7B, there is no difference in the bonding characteristics between the circuit element 301 and the circuit element 300 up to 20 GHz, but when the frequency is higher than 20 GHz, the insertion loss of the circuit element 301 is improved by about 5 dB and the return loss is improved by 25 dB, as compared with the circuit element 300. That is, the influence of the parasitic capacitance can be reduced by adopting the structure of the circuit element 301.

DESCRIPTION OF REFERENCE NUMERALS AND SIGNS 10, 10a: Thin Film Board
11: Through Hole (First Through Hole)
13: Electrode (Halfvia)
14: Bottom Surface (Land)
15: Front Wiring
17a: Back Wiring (First Back Metal)
18: Back Metal
20: Printed Circuit Board
21: Through Hole (Second Through Hole)
22: Top Metal
25: Transmission Line
27: Back Metal (Second Back Metal)
300, 301: Circuit Element

What is claimed is:
1. A thin film board comprising:
a first through hole that electrically connects a front surface and a back surface of the thin film board;
a back wiring through which a radio frequency electrical signal is propagated, that is electrically connected to the first through hole,
and is disposed on the back surface of the thin film board so as to extend from the first through hole to an end of the thin film board;
a front wiring through which the radio frequency electrical signal is propagated, that is electrically connected to the first through hole,
and is disposed on the front surface of the thin film board, in a direction which is opposite to and parallel with an extension direction of the back wiring from the first through hole; and
a first back metal provided on the back surface of the thin film board apart from the back wiring,
wherein a printed circuit board comprises a top metal on a top surface thereof, and a second back metal on the back surface thereof, and has a second through hole that electrically connects the top metal and the second back metal,
wherein the first through hole and second through hole have different axes from each other.
2. The thin film board according to claim 1, wherein the thin film board is a single-layer film.
3. A circuit element comprising:
a printed circuit board with a transmission line formed on a front surface thereof; and
a thin film board, wherein:
the thin film board includes:
a first through hole that electrically connects a front surface and a back surface of the thin film board,
a back wiring through which a radio frequency electrical signal is propagated to or from the transmission line, that is electrically connected to the first through hole,
and is disposed on the back surface of the thin film board so as to extend from the first through hole to an end of the thin film board, and
a front wiring through which the radio frequency electrical signal is propagated to or from the transmission line, that is electrically connected to the first through hole,
and is disposed on the front surface of the thin film board, in a direction which is opposite to and parallel with an extension direction of the back wiring from the first through hole, and
the thin film board is mounted on the printed circuit board such that the back wiring in an end portion of the thin film board comes into contact with a one end surface of the transmission line, wherein
the thin film board has a first back metal provided apart from the back wiring, on the back surface,
the printed circuit board has a top metal on a top surface thereof, and a second back metal on the back surface thereof, and has a second through hole that electrically connects the top metal and the second back metal, and the first back metal and the top metal come into contact with each other, and the first back metal has the same potential as a potential of the second back metal through the second through hole,
wherein the first through hole and second through hole have different axes from each other.

4. The circuit element according to claim 3, wherein the thin film board and the printed circuit board are fixed with an adhesive or solder.

5. A manufacturing method of the circuit element according to claim 3, the method comprising:
  forming the first through hole that electrically connects the front surface and the back surface of the thin film board at a position separated from the end of the thin film board by a predetermined distance;
  forming the front wiring on the front surface of the thin film board so as to be electrically connected to the first through hole;
  forming the back wiring that is electrically connected to the first through hole and extends to the end of the thin film board, on the back surface of the thin film board; and
  mounting the thin film board on the printed circuit board such that the back wiring in the end portion of the thin film board comes into contact with the one end surface of the transmission line formed on a front surface of the printed circuit board.

6. The circuit element according to claim 3, wherein the thin film board is a single-layer film.

7. The circuit element according to claim 3, wherein the first through hole and the transmission line do not to overlap each other.

* * * * *